(12) United States Patent
Taylor et al.

(10) Patent No.: US 9,599,679 B2
(45) Date of Patent: Mar. 21, 2017

(54) METAL DETECTOR

(75) Inventors: Alfred Alexander Taylor, Lugarno (AU); Darren Ken Alchin, Holsworthy (AU)

(73) Assignee: TNA Australia Pty Limited, Lidcombe (AU)

( * ) Notice: Subject to any disclaimer, the term of this patent is extended or adjusted under 35 U.S.C. 154(b) by 624 days.

(21) Appl. No.: 13/985,862

(22) PCT Filed: Sep. 2, 2011

(86) PCT No.: PCT/AU2011/001139
§ 371 (c)(1),
(2), (4) Date: Oct. 13, 2013

(87) PCT Pub. No.: WO2012/113010
PCT Pub. Date: Aug. 30, 2012

(65) Prior Publication Data
US 2014/0028309 A1    Jan. 30, 2014

(30) Foreign Application Priority Data

Feb. 25, 2011 (AU) ................ 2011900675
Jul. 25, 2011 (AU) ................ 2011902956

(51) Int. Cl.
  *G01V 3/10* (2006.01)
  *B07C 5/08* (2006.01)
  *B65G 11/20* (2006.01)
  *G01R 33/02* (2006.01)

(52) U.S. Cl.
  CPC ............... *G01R 33/02* (2013.01); *G01V 3/10* (2013.01)

(58) Field of Classification Search
  CPC ........... B07C 5/08; B07C 5/086; B65G 11/00; B65G 11/20; G01V 3/10
  USPC .......... 209/479, 567, 570; 193/2 R, 31 A, 33
  See application file for complete search history.

(56) References Cited

U.S. PATENT DOCUMENTS

| | | | | |
|---|---|---|---|---|
| 2,444,751 | A | * 7/1948 | Scott | ....... B07C 5/344 |
| | | | | 193/44 |
| 3,588,687 | A | 6/1971 | Kohler | |
| 3,655,039 | A | * 4/1972 | Kind | ....... B07C 5/362 |
| | | | | 193/23 |
| 4,171,262 | A | * 10/1979 | Lattmann | ........ B07C 5/344 |
| | | | | 209/555 |

(Continued)

FOREIGN PATENT DOCUMENTS

| JP | 3033314 U | 1/1997 |
|---|---|---|
| JP | 2000025718 A | 1/2000 |

(Continued)

OTHER PUBLICATIONS

US PG Pub 2014/0340099 A1, Butterworth et al., Nov. 20, 2014.*

(Continued)

*Primary Examiner* — Douglas Hess
(74) *Attorney, Agent, or Firm* — Kilpatrick Townsend & Stockton LLP

(57) ABSTRACT

A chute assembly (10) to deliver product to a former (11) of a packaging assembly. The chute assembly (10) includes a chute (14) that converges downwardly. Located adjacent the chute (14) is a metal detector (21) having a transmitting and receiving coils (22) of different diameters. The receiving coils (22) being adapted to provide a signal when metal is detected.

19 Claims, 3 Drawing Sheets

(56) References Cited

U.S. PATENT DOCUMENTS

| | | | | |
|---|---|---|---|---|
| 4,480,753 A | * | 11/1984 | Thomas | B07C 5/344 |
| | | | | 209/546 |
| 4,813,205 A | * | 3/1989 | Mikata | B65B 1/36 |
| | | | | 209/657 |
| 4,863,040 A | * | 9/1989 | Sandi | B07C 5/362 |
| | | | | 193/31 A |
| 5,263,651 A | * | 11/1993 | Nadarajah | D21B 1/023 |
| | | | | 162/55 |
| 5,377,847 A | * | 1/1995 | Kind | B07C 5/344 |
| | | | | 209/655 |
| 6,365,858 B1 | * | 4/2002 | Vicktorius | B07C 5/344 |
| | | | | 209/567 |
| 8,544,774 B1 | * | 10/2013 | Harbold | B02C 4/32 |
| | | | | 241/30 |

FOREIGN PATENT DOCUMENTS

| | | |
|---|---|---|
| JP | 2002-031567 A | 1/2002 |
| JP | 2002-156462 A | 5/2002 |
| WO | 2006/034911 A1 | 4/2006 |

OTHER PUBLICATIONS

International Search Report dated Nov. 11, 2011 in Application No. PCT/AU2011/001139.
GB Patent Application No. 1314116.3, Examination Report mailed Mar. 18, 2016, 4 pages.

* cited by examiner

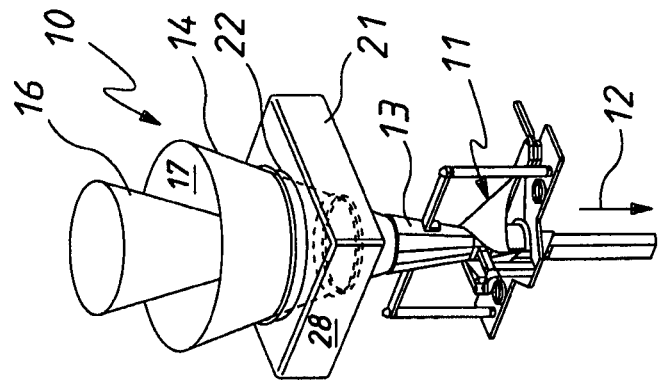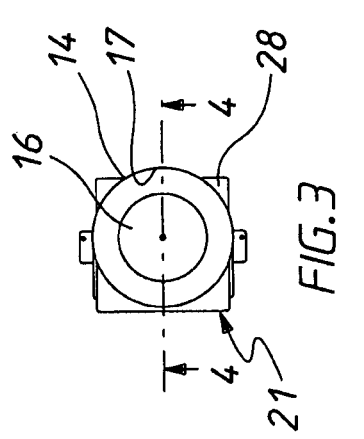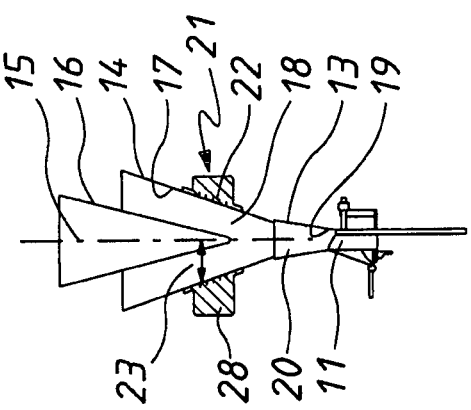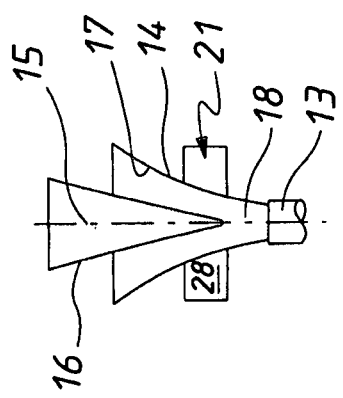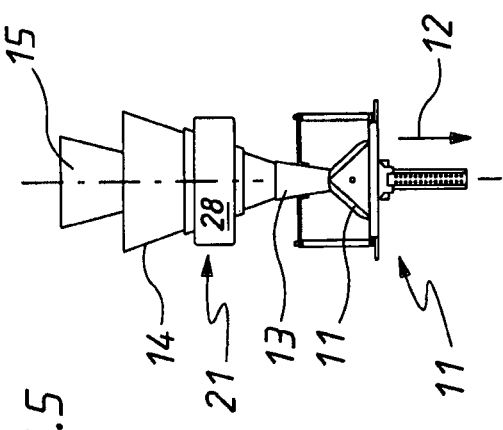

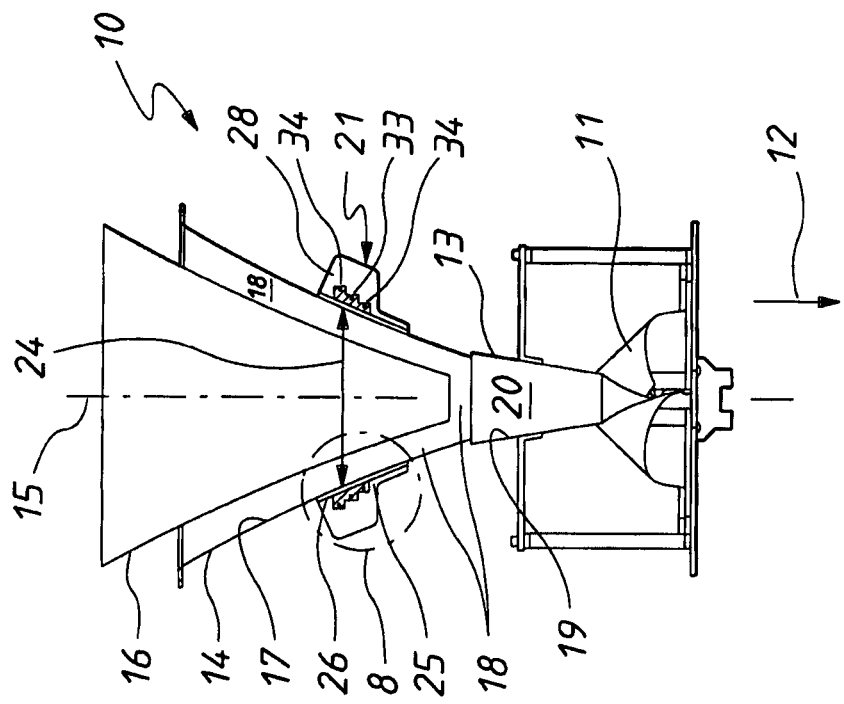
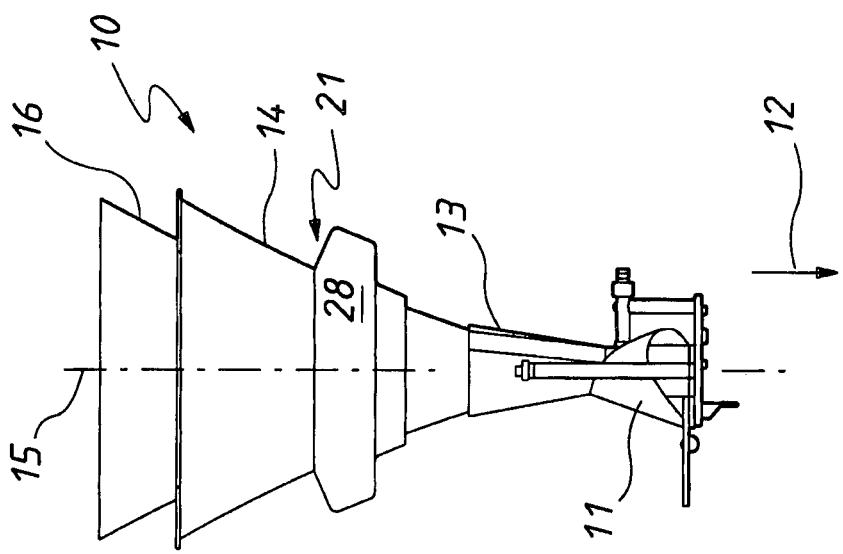

METAL DETECTOR

This application is a U.S. National Phase under 35 USC 371 of PCT Application No. PCT/AU2011/001139, filed Sep. 2, 2011, which claims priority to the Australian Application No. 2011902956, filed Jul. 25, 2011 and Australian Application No. 2011900675, filed Feb. 25, 2011, the disclosures of which are incorporated by reference herein.

TECHNICAL FIELD

The present invention relates to metal detectors and more particularly but not exclusively to metal detectors employed in the packaging industry.

BACKGROUND OF THE INVENTION

In the packaging of food products, it is important to detect any metal contamination for the purposes of eliminating the metal. This is done by removing, from the production stream, any packaging that contains metal. By also detecting metal in the production stream, operators are alerted to a possible failure in the machinery.

In the packaging of snack foods, product is delivered to a scale from where the product is delivered in batches to a former that leads to a packaging machine. In between the scale and the former, there are a number of chutes along which the product moves under the influence of gravity. Typically there is an upper chute and a lower chute, with the upper chute having sides that converge at a greater rate than the sides of the lower chute. As product passes from the upper chute to the lower chute, typically the product will have not only a downward directed velocity but also an angular velocity. The product also impacts against itself with the result that the product is often distributed across the entire interior of the lower chute.

Metal detectors are applied to the lower chute as it is of a much smaller diameter. However the metal detectors need to be of a substantial strength to detect any metal that may be placed towards the centre of the lower chute. Despite this, metal detectors have the disadvantage that some metal, frequently small pieces located towards the centre of the lower chute, will pass the metal detector without detection. Obviously this is a disadvantage as the metal finds its way into the food packages.

"Industrial metal detectors are used in the pharmaceutical, food, beverage, textile, garment, plastics, chemicals, lumber, and packing industries.

Contamination of food by metal shards from broken processing machinery during the manufacturing process is a major safety issue in the food industry. Metal detectors for this purpose are widely used and integrated into the production line." (Wikipedia)

"The basic principle of operation for the common industrial metal detector is based on a three coil design. This design utilises an AM (amplitude modulated) transmitting coil and two receiving coils one on either side of the transmitter. The design and physical configuration of the receiving coils are instrumental in the ability to detect very small metal contaminates of 1 mm or smaller. Today modern metal detectors continue to utilise this configuration for the detection of tramp metal.

The coil configuration is such that it creates an opening where by the product (food, plastics, pharmaceuticals, etc.) passes through the coils. This opening or aperture allows the product to enter and exit through the three coil system producing an equal but mirrored signal on the two receiving coils. The resulting signals are summed together effectively nullifying each other.

When a metal contaminate is introduced in to the product an unequal disturbance is created. This then creates a very small electronic signal that is amplified through special electronics. The amplification produced then signals a mechanical device mounted to the conveyor system to remove the contaminated product from the production line. This process is completely automated and allows manufactures to operate uninterrupted." (Wikipedia)

OBJECT OF THE INVENTION

It is the object of the present invention to overcome or substantially ameliorate the above disadvantage.

SUMMARY OF THE INVENTION

There is disclosed herein a metal detector including:
a plurality of winding surrounding a generally central axis and spaced therefrom so as to surround a passage and so that each winding surrounds a winding area extending transverse of said axis, said passage having a first end and a second end spaced axially from the first end, with the passage at said second end having a smaller cross-sectional area than at said first end; and wherein
adjacent said passage the windings are spaced from said axis by a distance, with said distance diminishing from said first end toward said second end so that the winding areas decrease in area toward said second end.

Preferably, said distance is a radius from said axis, so that the radius of the winding diminishes from said first end to said second end.

Preferably, said passage, between the first and second ends, is frusto-conical in configuration.

Preferably, said passage has a longitudinal side that is arcuate in side elevation so as to be radially inwardly concave.

Preferably, the windings include a transmitting coil and a receiving coil.

Preferably, the windings include a transmitting coil located between two receiving coils.

Preferably, the receiving coils include a first receiving coil and a second receiving coil, with the transmitting coil being located between the first coil and the second coil.

Preferably, the distance the first coil is spaced from said axis is greater than the distance the transmitter coil is spaced from said axis and the distance the second coil is spaced from said axis, and the distance the transmitter coil is spaced from said axis is greater than the distance the second coil is spaced from said axis.

Preferably, the coils are located at longitudinally spaced positions relative to said axis and are co-axial.

Preferably, the metal detector further includes a body within which the winding are located, said body having an internal longitudinal body surface surround said passage, with said body surface converging downward.

There is further disclosed, in combination, any one of the above metal detectors and a chute having a generally upright central axis, with said chute surrounding said passage and converging downwardly, and wherein said body surrounds said chute so as to be adjacent said chute to position the metal detector to detect metal passing along said passage.

Preferably, the combination further includes a guide member located in the chute to aid in maintaining product moving down the chute adjacent the chute.

There is further disclosed herein a chute assembly for a packaging machine, the chute assembly including:

a first chute having the internal surface to direct the product downwardly, said surface having an inclination to the horizontal;

a second chute, the second chute being below the first chute so as to receive product therefrom, the second chute having an internal surface with an inclination to the horizontal, with the inclination of the surface of the second chute being greater than the inclination of the surface of the first chute; and a metal detector surrounding the internal surface of the first chute to detect metal passing through the first chute.

Preferably, the chute assembly further includes a guide member located within the first chute so as to provide a passage, between said surface of the first chute and guide, along which the product travels, said passage having a longitudinal length at least over a portion which said passage is annular in configuration, with the said metal detector being located at said portion to detect metal passing along said portion.

Preferably, the internal surface of said second chute is frusto-conical.

Preferably, the first and second chutes have a common generally upright central axis.

Preferably, the internal surface of said first chute is arcuate so as to be concave radially inwardly.

Preferably, the chute assembly includes a metal detector as described above.

BRIEF DESCRIPTION OF THE DRAWINGS

Preferred forms of the present invention will now be described by way of example with reference to the accompanying drawings wherein:

FIG. 1 is a schematic isometric view of a chute assembly and packaging machine former to deliver batches of product to a packaging machine;

FIG. 2 is a schematic side elevation of the chute assembly and former of FIG. 1;

FIG. 3 is a schematic top plan view of the chute assembly and former of FIGS. 1 and 2;

FIG. 4 is a parts sectioned schematic side elevation of the chute assembly and former of FIG. 3 sectioned along the line 4-4;

FIG. 5 is a schematic sectioned side elevation of the modification of the upper chute of the chute assembly as shown in FIG. 4;

FIG. 6 is a schematic side elevation of a modification of the chute assembly of FIG. 1;

FIG. 7 is a schematic sectioned side elevation of the chute assembly of FIG. 6.

DETAILED DESCRIPTION OF THE PREFERRED EMBODIMENTS

Figure 8:
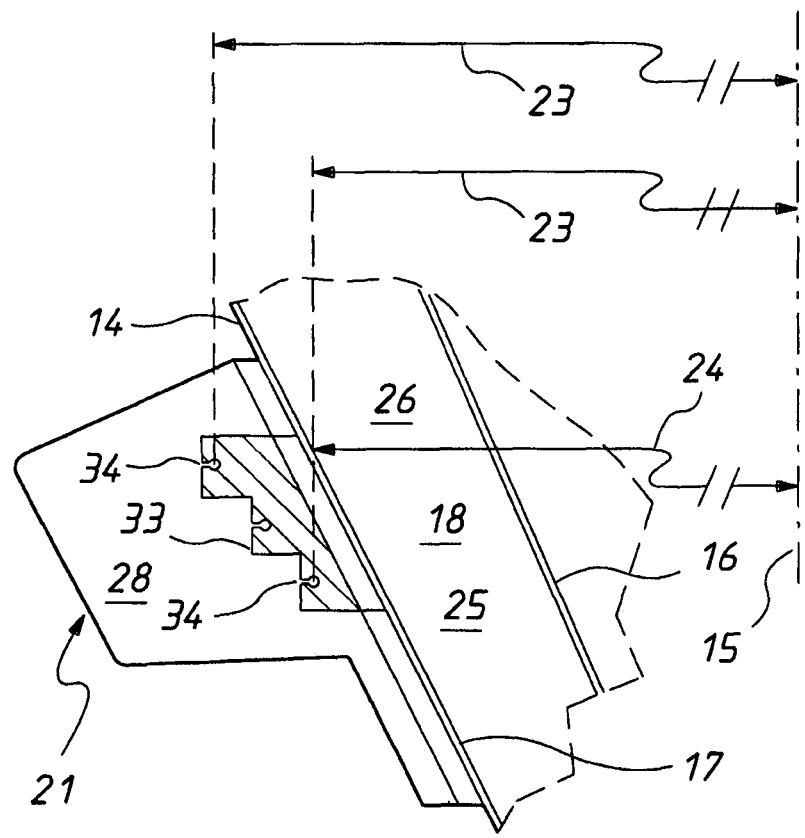
FIG. 8 is a schematic enlarged view of the portion 8 of the chute assembly as shown in FIG. 7.

In the accompanying drawings there is schematically depicted a chute assembly 10 that delivers product to a former 11. The product falls under the influence of gravity through the assembly 10 in the direction 12. The former 11 receives sheet material in the form of a strip and configures the strip into a tubular configuration that passes from the former 11 in the direction 12. Product being packaged is delivered to the interior of the tubular bag material, with the tubular bag material and product then delivered to a packaging machine (below the former 11) which forms packages of the product.

Located above the former 11 is a lower chute 13 that receives product from an upper chute 14. The chutes 13 and 14 in these embodiments have a common generally upright central longitudinal axis 15.

Projecting internally of the chute 14 is a guide member 16 that is preferably conical or frusto-conical in configuration. The guide member 16 is placed centrally of the chute 14 so as to be spaced from the surface 17. The chute 14 has an internal surface 17 of frusto-conical configuration so that incorporation with the member 16, the surface 17 surrounds a passage 18 along which product flows. The passage 18 adjacent the member 16 is annular in configuration. The chute 13 has an internal surface 19 surrounding a passage 20 along which product flows. The surface 19 is frusto-conical in configuration.

Surrounding the chute 14 is a metal detector 21. The metal detector 21 has a plurality of windings 22 that surround a passage 24 through which the chute 14 projects. The windings 22 are embedded in a body 28. Accordingly the windings 22 surround the chute 14, the surface 17 and the longitudinal axis 15. The windings 22 adjacent the surface 17 are spaced from the axis 15 by a radius 23. The lower windings 22 at the lower end 25 of the passage 24 are located closer to the axis 15, therefore the radius 23 diminishes downwardly from the upper end 26. The chute 14 encloses a cross-sectional area at the upper end that is greater than the cross-sectional area at the lower end to accommodate the reduction of the radius 23.

In this embodiment, the windings 22 conform to the external configuration of the chute 14. Therefore the windings 22 adjacent the chute 14 defines a shape consistent with the chute 14. In this embodiment, the chute 14 is frusto-conical, therefore the windings adjacent the chute 14 will define, in combination, a configuration that is frusto-conical. As an example the upper windings 22 and the lower windings 22 may be receiving windings (receiving coils 22) and the central windings 22 may be transmitting windings (transmitting coils 22). The windings 22 would be circular in configuration so as to have as their central axis, the axis 15. The windings 22 are located at longitudinally spaced portions relative to the axis 15, as best seen in FIG. 8. That is the windings 22 are co-axial but spaced.

In the embodiment of FIG. 5, the upper chute 14 has a side wall (circular in transverse cross-section) that is parabolic in side elevation so as to be concave when viewed from the exterior.

In the above described preferred embodiments, the windings 22 are spaced from the axis 15 by a distance. Since the chute 14 is circular in transverse cross-section (as opposed to other configurations), the distance is the radius 23.

In the embodiment of FIGS. 6 to 8, the guide 16 is truncated at its lower end. The guide member 16 has a convex curved surface 27 (in side elevation) while surface 17 is also curved in side elevation.

Also in the above preferred embodiments, since the chute 14 is circular in transverse cross-section, the passage 24 is circular in transverse cross-section. The cross-sectional area of the passage 24 is determined by the radius 23 at the end 26, and the radius 23 at the end 25 and the configuration of the metal detector body 28.

In the embodiment of FIGS. 6 to 8, the body 28 includes a metal housing 30 within which a winding support 31 is located. The support 30 is formed of electrically insulating material and has grooves 32 that receive the windings 22 that provide the transmitting coil 33 and receiving coils 34. The cross-sectional area of the passage 24 diminishes from the end 26 to the end 25. Accordingly, the area (winding area) encompassed by each of the coils 33 and 34 diminishes towards the lower end of the passage 18, that is the lower end of the chute 14. Each winding area is transverse of the axis 15.

As best seen in FIGS. 4, 7 and 8, the body 28 has an internal longitudinal body surface 29 that surrounds the chute 14 and therefore the passage 18. The surface 29 converges downwardly. The body 29 surround and is located adjacent the chute.

The transmitting coil 33 would be an amplitude modulated transmitting coil that is electrically energised to produce a field to induce a current (voltage) in the receiving coils 34. Preferably, the receiver coils 34 could be balanced. This could be achieved by having the receiving coils 34 with a number of loops or windings, with the number of loops or windings adjusted to provide a balance, or an approximate balance. However the two receiving coils 34 are merely required to produce an electric signal when metal passes the coils 34. As a further example, the two receiving coils 34 could produce a signal indicative of a steady state (normal) operation of the metal detector 21, with "instantaneous" signals compared to the steady state signal to provide an indication when metal passing through the coils 34. It should also be appreciated there could be one or more receiving coils 34, but preferably two receiving coils 34.

The above described preferred embodiments have the advantage that in the upper chute 14, the product is located adjacent the surface 17, as opposed to the surface 19 of the lower chute 13, in contrast to product entering the passage 20. Typically product with the passage 20 impacts against itself which causes the product to be distributed across the passage 20.

Since the product is located adjacent the surface 17 any metal with the product, will move adjacent the windings 22 and therefore have a greater chance of being detected.

The invention claimed is:

1. A chute assembly for a packaging apparatus, the chute assembly including:
    a first chute having an internal surface that converges downwardly to direct product downwardly, said surface having an inclination to the horizontal and being of a circular transverse cross-section;
    a second chute, the second chute being below the first chute so as to receive product therefrom, the second chute having an internal surface that converges downwardly and that has an inclination to the horizontal, and that has a circular transverse cross-section, with the inclination of the surface of the second chute being greater than the inclination of the surface of the first chute;
    a metal detector surrounding the internal surface of the first chute to detect metal passing through the first chute; and wherein
    the first and second chutes have a common generally central upright longitudinal axis.

2. The assembly of claim 1, further including said assembly includes a guide member located within the first chute so as to provide a passage, between said surface of the first chute and guide, along which the product travels, said passage having a longitudinal length at least over a portion which said passage is annular in configuration, with the said metal detector being located at said portion to detect metal passing along said portion.

3. The assembly of claim 1, wherein the internal surface of said second chute is frusto-conical.

4. The assembly of claim 1, wherein the internal surface of said first chute is arcuate so as to be concave radially inwardly.

5. The assembly of claim 1, wherein said first chute surrounds a passage, and said metal detector includes:
    a body adjacent the first chute to detect metal passing along the passage;
    a plurality of windings located in the body and surrounding said axis and spaced therefrom so as to surround the passage with each winding surrounding a winding area extending generally transverse of said axis, with said passage having a first end and a second end spaced axially from the first end, with the passage at said second end having a smaller cross sectional area than at said first end; and wherein
    adjacent the passage, the windings are spaced from said axis by a distance, with the distance diminishing from said first end towards said second end so that the winding areas decrease in area towards said second end.

6. The assembly of claim 5, wherein the windings include a transmitting coil located between two receiving coils.

7. A chute assembly including:
    a chute having a generally upright central axis, with said chute surrounding a chute passage along which product passes and that covers downwardly, said passage having a first end and a second end spaced downwardly axially from the first end, with the passage at said second end having a smaller cross-sectional area than at said first end;
    a metal detector to detect metal passing along said passage, said metal detector including:
    a plurality of windings surrounding said axis and said passage so that each winding surrounds a winding area extending transverse of said axis, with the windings being adjacent the chute but spaced from said axis by a distance, with said distance diminishing from said first end toward said second end so that the winding areas decrease in area toward said second end.

8. The chute combination claim 7, wherein said distance is a radius from said axis, so that the radius of the winding diminishes from said first end to said second end.

9. The chute combination of claim 7, wherein said passage, between the first and second ends, is frusto-conical in configuration.

10. The chute combination of claim 7, wherein said passage has a longitudinal side that is arcuate in side elevation so as to be radially inwardly concave.

11. The chute combination of claim 7, wherein the windings include a transmitting coil and a receiving coil.

12. The chute combination of claim 11, wherein the coils are located at longitudinally spaced positions relative to said axis and are co-axial.

13. The chute combination of claim 7, wherein the windings include a transmitting coil located between two receiving coils.

14. The chute combination of claim 13, wherein the receiving coils include a first coil and a second coil, with the transmitting coil being located between the first coil and the second coil.

15. The chute combination of claim 14, wherein the distance the first coil is spaced from said axis is greater than the distance the transmitter coil is spaced from said axis and the distance the second coil is spaced from said axis, and the distance the transmitter coil is spaced from said axis is greater than the distance the second coil is spaced from said axis.

16. The chute combination of claim 7, further including a body within which the winding are located, said body having an internal longitudinal body surface surround said passage, with said body surface converging downward.

17. The chute combination of claim 7, further including a guide member located in the chute to aid in maintaining product moving down the chute adjacent the chute.

18. A chute assembly including:
a chute having a generally upright central axis, with said chute surrounding a chute passage along which product passes and that covers downwardly, said passage having a first end and a second end spaced downwardly axially from the first end, with the passage at said second end having a smaller cross-sectional area than at said first end;
a metal detector to detect metal passing along said passage, said metal detector including:
a first receiving coil and a second receiving coil, each coil surrounding said passage with the coils being spaced axially;
a transmitting coil surround said passage and located between the receiving coils; and wherein
the first coil has a radius, the transmitting coil has a radius less than the first coil, and the second coil is below the transmitting coil and has a radius less than the transmitting coil, with each coil surrounding an area extending generally transverse of said axis.

19. The chute assembly of claim 18, wherein the chute has an internal surface, surrounding said passage, that is arcuate so as to be concave radially inward.

* * * * *